(12) United States Patent
Fong

(10) Patent No.: US 6,211,737 B1
(45) Date of Patent: Apr. 3, 2001

(54) VARIABLE GAIN AMPLIFIER WITH IMPROVED LINEARITY

(75) Inventor: Keng Leong Fong, Sunnyvale, CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/354,603

(22) Filed: Jul. 16, 1999

(51) Int. Cl.[7] ............................. H03G 3/12; H03G 3/30
(52) U.S. Cl. ........................ 330/282; 330/98; 330/284
(58) Field of Search ........................ 330/98, 100, 282, 330/284, 311

(56) References Cited

U.S. PATENT DOCUMENTS

| | | | |
|---|---|---|---|
| 3,512,096 | * 5/1970 | Nagata et al. | 330/284 |
| 3,892,983 | 7/1975 | Okada et al. | 307/254 |
| 4,011,519 | 3/1977 | Kawamura et al. | 330/29 |
| 4,021,749 | 5/1977 | Ishigaki et al. | 330/22 |
| 5,047,731 | * 9/1991 | Lee | 330/282 |
| 5,323,123 | * 6/1994 | Philippe | 330/284 |

* cited by examiner

Primary Examiner—Michael B Shingleton
(74) Attorney, Agent, or Firm—Brian J. Wieghaus

(57) ABSTRACT

A circuit includes a transconductance stage which converts an input signal power into a signal current and supplies it to an output of the circuit. A current diverting circuit branch is coupled to selectively divert the current from the transconductance stage away from the output. A feedback network feeds back a portion of the current diverted away from the output to the input of the transconductance stage. When implemented as a variable gain amplifier, the current diverting branch functions to change a gain of the circuit from a high level to one or more lower levels. The feeding back of a portion of the diverted current to the input improves the linearity of the circuit in the lower gain mode(s).

14 Claims, 2 Drawing Sheets

VARIABLE GAIN AMPLIFIER WITH IMPROVED LINEARITY

BACKGROUND OF THE INVENTION

1. Field of the Invention

The invention relates generally to gain control amplifier circuits and, more particularly, to a feedback technique which improves the linearity when switching from a high gain mode to one or more lower gain modes.

2. Description of the Prior Art

Variable gain amplifiers ("VGA's") are used in numerous electronic products such as global positioning (GPS) receivers, wireless local area networks and mobile communication devices, such as cordless and cellular phones. In particular, VGA's are used in the various parts of such devices, for example, in the radio frequency (RF) input stage, intermediate frequency (IF) and low frequency or baseband circuits of these devices.

The linearity of a circuit may be defined by various parameters. For example, the input third-order intercept point represents third-order non-linearity in the transfer function of a circuit. Due to the third-order non-linearity, two undesired signals in adjacent channels generate output third-order intermodulation products (IM3) which can corrupt the desired signal at the output. The power of the desired signal at the output of a linear circuit increases linearly with the input power of the circuit. However, the power of the output IM3 increases with the cube of the input power. The input third-order intercept point is the input power level, at which the power of the desired signal at the output of a circuit is equal to the power of the output IM3.

FIG. 1 shows a typical low-noise amplifier (LNA) 10 for amplifying input signals, such as radio-frequency signals propagating through receiving circuitry of a wireless system, such as a cellular telephone. A signal input $RF_{in}$ is provided for receiving an input signal from a source, such as a tuner or the previous amplifier stage. The input signal is supplied to the base of an NPN junction transistor Q1. A degeneration impedance Ze is coupled between the emitter of the transistor Q1 and a ground terminal. The transistor Q1 and the impedance Ze function as a common-emitter transconductance stage.

An NPN junction transistor Q2 is connected to the transistor Q1 in a cascode configuration. The emitter of the transistor Q2 is connected to the collector of the transistor Q1. The base of the transistor Q2 is supplied with bias voltage from a bias circuit which can be either on chip or off chip. A resistor R1 and an inductor L1 are coupled between the collector of the transistor Q2 and a source of collector voltage Vcc. A capacitor C1 is arranged between the collector of the transistor Q2 and an output $RF_{out}$ of the low noise amplifier 10.

The resistor R1 is an output-matching resistor that functions to match the output impedance of the low noise amplifier 10 with the impedance of a load coupled to the output $RF_{out}$. The inductor L1 and capacitor C1 form an impedance transformation network that transforms the output impedance defined by the resistor R1 to match the impedance of the load. The inductor L1 also serves as a pull-up inductor that increases the allowable voltage at the collector of the transistor Q2.

The gain of the amplifier of FIG. 1 is controlled in discrete steps by using a well-known current dividing or splitting technique. A switch in the form of an NPN transistor Q3 having its emitter coupled to the collector of the transconductance device Q1 and its collector coupled to the power supply Vcc is provided with a control signal at its base B to render the switch conductive or non-conductive. When the switch Q3 is in the non-conductive state, the amplifier is in the high gain mode and all of the current from the transconductance stage is delivered to the output $RF_{out}$. When the switch Q3 is conductive, the amplifier is in a reduced gain mode, as current is diverted from the output and dumped to the power supply by the switch Q3, thereby reducing the gain at the output $RF_{out}$ relative to the input $RF_{in}$. In other words, current from the transistor Q2 is split into two paths, with some of the current diverted through the transistor Q3 and the remaining current provided to the output. In this current splitting technique, the gain step between the two gain modes depends on the device size ratios between the transistors Q2 and Q3 (with all emitters connected to the same node). This gain control scheme can be expanded by connecting additional transistors in parallel with transistors Q2 and Q3 (with all emitters connected to the same node).

A disadvantage of the gain control scheme of FIG. 1 is that the VGA has the same linearity in both high and lower gain modes. In many applications, the VGA is required to have higher linearity when the VGA is switched from the high to the lower gain modes. When the VGA is switched to lower gain modes, it is typically because of higher input signal power, so increased linearity is desired.

It would be desirable to create a new technique that improves the linearity of a VGA when it is switched from a high gain mode to a lower gain mode.

SUMMARY OF THE INVENTION

Various advantages of the invention are achieved at least in part by providing an electronic circuit, such as an amplifier, which includes: (i) a transconductance stage which converts an input signal power into a signal current and supplies the current to an output of the circuit, (ii) a current diverting circuit branch coupled to selectively divert the current from the transconductance stage away from the output and (iii) a feedback network which feeds back a portion of the current diverted away from the output to the input of the transconductance stage. When implemented as a variable gain amplifier, the current diverting branch functions to change a gain of the circuit from a high level to one or more lower levels.

The invention is based in part on the recognition that in known VGA's as discussed with reference to FIG. 1, the linearity of the VGA is dominated by the linearity of the transconductance stage. The feeding back of a portion of the diverted current to the input improves the linearity of the circuit in the lower gain mode(s). Furthermore, since the feedback network does not couple the output to the input, the isolation of the output relative to the input is not compromised.

In accordance with one aspect of the present invention, the transconductance stage includes a first transistor having a control terminal, such as the base of a bipolar transistor or the gate of a MOS transistor, coupled to receive the input signal. A degeneration impedance may be provided between a main current electrode, such as an emitter or source, of the first transistor and a ground terminal.

According to another aspect of the invention, the current diverting branch includes a switching transistor which receives a bias voltage to control the conductance of the switch and thereby the diversion of current through said current diverting branch. The circuit may include a plurality of current diverting branches to implement an amplifier having several gain modes. The circuit may have more than one feedback network in dependence on the number of gain modes for which improved linearity is desired.

According to yet another aspect of the invention, the feedback network includes an impedance network coupled between an output terminal of the switching transistor of the current diverting branch and the input of the transconductance stage. The invention also concerns a method of feeding back a portion of current diverted from the output of a variable gain amplifier to improve the linearity of one or more gain modes.

These and other object, features and advantages of the invention will become apparent with reference to the following detailed description and the drawings.

DESCRIPTION OF THE PREFERRED EMBODIMENTS

Figure 2:
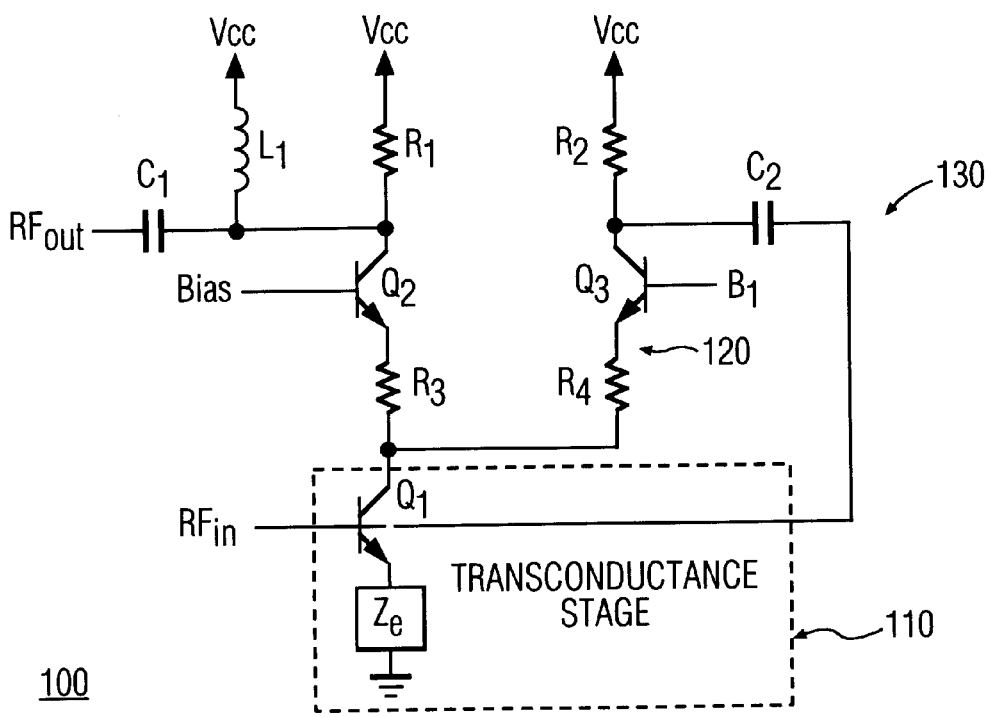
FIG. 2 is a circuit diagram of a VGA according to the invention with partial current feedback to improve linearity in the lower gain modes.

Although the invention has general applicability in the field of electronic circuits, the best mode for practicing the invention is based in part on the realization of variable gain amplifiers using partial current feedback. Referring to FIG. 2, a low noise amplifier 100 of the present invention comprises a signal input RFin for supplying signals, for example, radio-frequency signals propagating through receiving circuitry of a wireless system, from a source, such as the previous stage of the receiving circuitry. For example, the amplifier 100 may operate at 0.9 GHz.

The input signal is supplied to the base of an NPN junction transistor Q1. A degeneration impedance Ze may be coupled between the emitter of the transistor Q1 and a ground terminal. For example, an inductor having an inductance selected in the range between 1 nH and 3 nH may be used as the degeneration impedance Ze. The transistor Q1 and the impedance Ze function as a common-emitter transconductance stage 110 to transform the power of the input signal into current produced on the collector of the transistor Q1. The impedance Ze is preferred; however, the emitter of the transistor Q1 may be connected directly to ground.

An NPN junction transistor Q2 is connected to the transistor Q1 in a cascode configuration to isolate an output RFout of the amplifier 100 from the transconductance stage. The base of the transistor Q2 is supplied with bias voltage, for example, about 2 V from a bias input Bias. This bias voltage may be supplied from either an on or off chip circuit. A resistor R1 and an inductor L1 are coupled between the collector of the transistor Q2 and a source of collector voltage Vcc. For example, the collector voltage may be equal to about 3 V.

A capacitor C1 is arranged between the collector of the transistor Q2 and the output RFout of the low noise amplifier 100. For example, for an operating frequency of 0.9 GHz, the capacitance of the capacitor C1 may be selected to be 1 pF, the resistance of the resistor R1 may be 200 Ohm, and the inductance of the inductor L1 may be selected to be 5 nH.

The resistor R1 functions as an output-matching resistor that matches the output impedance of the low noise amplifier 100 with the impedance of a load coupled to the output RFout. The inductor L1 and capacitor C1 form an output impedance transformation network to match the output impedance of the amplifier 100 with the impedance of the load. The inductor L1 also serves as a pull-up inductor that increases the allowable voltage at the collector of the transistor Q2. Although the present invention is disclosed with the example of bipolar transistors, one skilled in the art will realize that field effect transistors may be used as the transistors Q1 and Q2.

A current diverting circuit branch 120 includes an NPN transistor Q3 with its emitter coupled to the collector of the transconductance device Q1 and its collector coupled to the power supply Vcc. The transistor Q3 is provided with a control signal at its base B1 to switch it between a conductive and a non-conductive state. When the switch Q3 is in the non-conductive state, the amplifier is in the high gain mode and all of the current from the transconductance stage is delivered to the output $RF_{out}$. When the switch Q3 is in the conductive state, the amplifier is in a reduced gain mode, as current from transistor Q1 is diverted to the power supply by the switch Q3, thereby reducing the current supplied to the output ($RF_{out}$) and reducing the gain at the output $RF_{out}$ relative to the input $RF_{in}$.

To improve the linearity of the low noise amplifier 100 when switched to the low gain mode, a feedback network 130 is arranged to at least partially feed the current diverted from the output $RF_{out}$ back to the input of the transconductance stage, in this case $RF_{in}$. The feedback network includes a resistor R2 coupled between the collector of the switch Q3 and supply Vcc and a feedback capacitor C2 coupled between the collector of the transistor Q3 and the base of the transistor Q1. The feedback capacitor C2 may be the internal capacitance of transistor Q1.

When the transistor Q3 is biased to divert current from the output, part of the diverted current that flows through the transistor Q3 is fed back to the input of the transconductance stage at the base of the transistor Q1 through a shunt feedback network 130. In this example, the network includes a resistor R2, coupled between an output terminal (in this case collector) of the switching transistor Q3 and the supply Vcc, and a capacitor C2 coupled between the output terminal of the transistor Q3 and the control terminal, or base, of the transistor Q1. Other impedance elements may be used. The feedback current improves the linearity of the LNA in the low gain mode.

The following table illustrates the improvement in input third-order intercept point (IIP3) due to the shunt feedback network of the invention. The measurements were taken at an input signal of 0.9 GHz.

Figure 1:
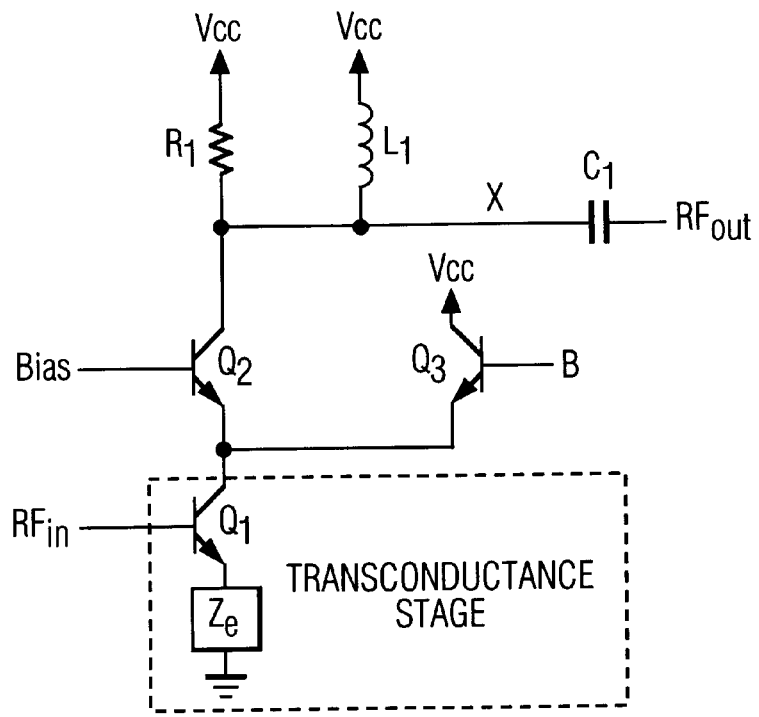
FIG. 1 is a circuit diagram of a prior art current splitting VGA.

| | Input IP3 (dBm) | |
|---|---|---|
| | High-Gain Mode | Low-Gain Mode |
| Without Shunt Feedback (FIG. 1) | −1 | −1 |
| With Shunt Feedback (FIG. 2) | −1 | 2 |

The value of the resistor R2 and the capacitor C2 are chosen to improve the linearity in the low-gain mode without compromising the input return loss (the amount of input power reflected back to the source) of the LNA. Linearity improves with the increased values of R2 and C2, but the input return loss degrades accordingly.

The reverse isolation of a circuit is the isolation of the input of the circuit from a signal at the output of the circuit. Traditional feedback loops in amplifiers establish a connection between the input of an amplifier and its output, and hence reduce reverse isolation of the amplifier. By contrast, since the shunt feedback network 130 does not connect the input $RF_{in}$ to the output $RF_{out}$, it does not degrade the reverse isolation of the VGA provided by the transistor Q2.

The resistors R3 and R4, coupled respectively between the collector of the transistor Q1 and the emitters of transistors Q2 and Q3, control how the current is split between the output $RF_{out}$ and the current diverting branch 120. The gain step between the two gain modes is depends on the resistance ratios between the resistors R3 and R4. For example, if the resistors R3 and R4 have the same resistances, the gain step is 6 dB. Although control of the current splitting can be accomplished in the absence of transistors Q2, Q3, the use of the resistors R3, R4 provides better control. In an integrated circuit, resistors can generally be fabricated with much tighter tolerances than transistors, the use of resistors thus providing tighter control of the current splitting. It should be noted that the resistors typically have enough resistance that the current splitting becomes independent of the sizing of the transistors. The resistors R3 and R4 also reduce the noise contribution from the transistors Q2 and Q3 in the low gain mode.

Thus, the amplifier 100 has a series-feedback circuit provided by the degeneration impedance Ze, and an additional shunt-feedback circuit provided by the feedback network 130 which is effective to feed back a portion of any current diverted by the branch 120 to improve the linearity in the low gain mode.

Figure 3:
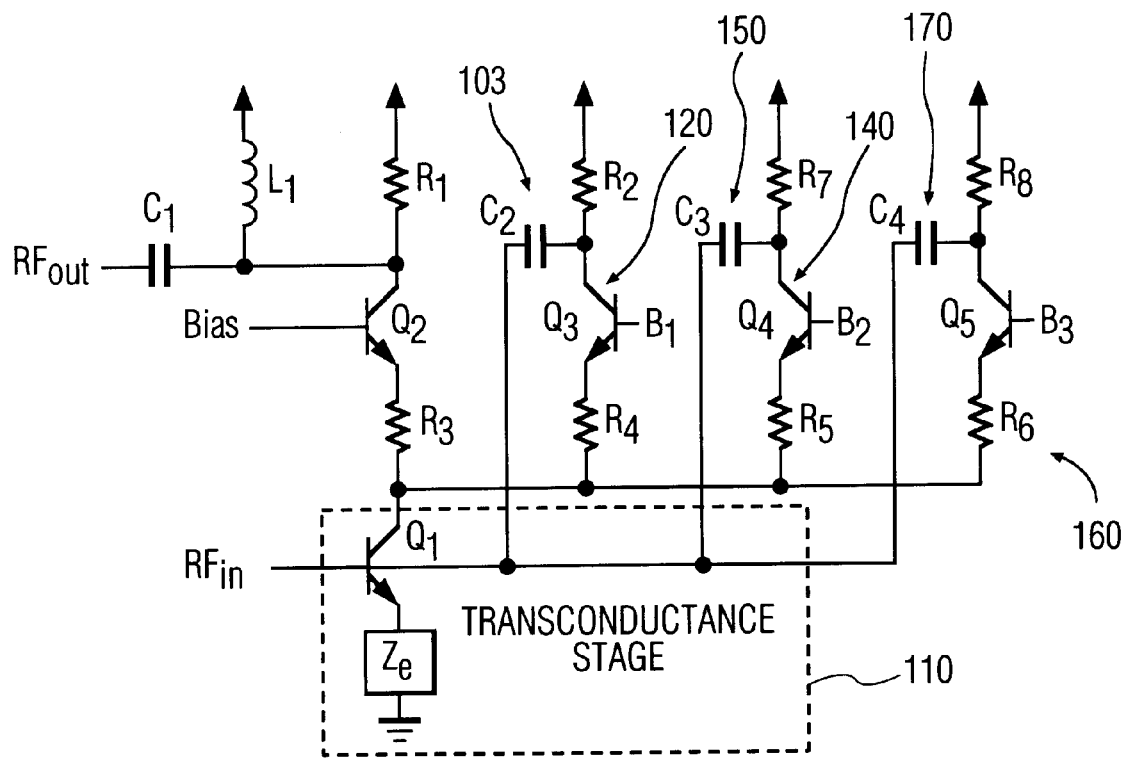
FIG. 3 is a circuit diagram similar to that of FIG. 2, but illustrating additional current diverting branches for implementing additional gain modes.

FIG. 3 illustrates the circuit according to the invention extended to include further gain modes. Components corresponding to those in FIG. 2 bear the same references. Two additional current diverting branches 140 and 160 are coupled to the transconductance stage via the collector of the transconductance device Q1 and include, respectively, a resistor R5 and an NPN transistor Q4, and a resistor R6 and a further NPN transistor Q5. Shunt feedback networks 150 and 170 include a resistor R7 and capacitor C3, and a resistor R8 and a capacitor C4, respectively. The bases B2 and B3 of the transistors Q4 and Q5 receive appropriate bias voltages to divert or to not divert current from the output $RF_{out}$ to achieve second and third further gain modes in the same manner as applied to the base B1 of the transistor Q3. The resistors R5 and R6, as well as the feedback networks 150 and 170 function in a corresponding manner to the resistor R4 and the feedback network 130, respectively. Those of ordinary skill in the art will appreciate that the sizes of the devices Q4, Q5, the level of the bias voltages applied at bases B2 and B3, and the resistance values of the resistors R5 and R6 may be adjusted to control gain step between the various gain modes.

In this disclosure, there are shown and described only the preferred embodiments of the invention, but it is to be understood that the invention is capable of changes and modifications within the scope of the inventive concept as expressed herein. For example, MOS devices may be used in place of the bipolar devices shown.

What is claimed is:

1. An electronic circuit, comprising:
   an input which receives an input signal;
   a transconductance stage which transforms a power of the input signal into a current;
   an isolation stage, operably coupled to the transconductance stage, that provides an output that is isolated from the input signal and is supplied with current by the transconductance stage;
   a first diverting circuit branch coupled to said transconductance stage and which selectively diverts current from said output, the first diverting circuit branch being isolated from the output by the isolation stage; and
   a feedback network coupled between said first diverting circuit branch and said input and which feeds back a portion of the current diverted from said output through said first diverting circuit branch to said input.

2. An electronic circuit according to claim 1, wherein said transconductance stage includes a bipolar transistor having a base coupled to said input, a collector coupled to said isolation stage and to said first diverting circuit branch, and an emitter.

3. An electronic circuit according to claim 2, wherein said transconductance stage further includes an emitter degeneration impedance coupled to said emitter of said bipolar transistor.

4. An electronic circuit according to claim 2, wherein said feedback network includes a shunt feedback network including an RC pair comprising a first capacitance and a first resistance.

5. An electronic circuit according to claim 4, wherein:
   said first diverting circuit branch includes a switch controllable between
      (a) a conductive state to divert current from said output and
      (b) a non-conductive state in which current is not diverted from said output; and
   said isolation stage comprises a cascode transistor coupled between said collector of said bipolar transistor and said output.

6. An electronic circuit according to claim 5, further comprising
   a second resistance coupled between said collector of said bipolar transistor and said cascode transistor, and
   a third resistance coupled between said switch of said first diverting circuit branch and said collector of said bipolar transistor,
   the portion of current diverted through said first diverting circuit branch being dependent on said second and third resistances.

7. An electronic circuit according to claim 1, wherein said feedback network includes an impedance.

8. An electronic circuit according to claim 1, wherein:
   said first diverting circuit branch includes a switch controllable between a conductive state to divert current from said output and a non-conductive state in which current is not diverted from said output; and
   said isolation stage comprises a cascode transistor coupled between said collector of said bipolar transistor and said output.

9. An electronic circuit according to claim 1, further comprising
   a first resistance coupled between said transconductance stage and said output, and
   a second resistance coupled in said first diverting circuit branch,
   the portion of current diverted through said first diverting circuit branch being dependent on said first and second resistances.

10. An electronic circuit according to claim 1, comprising further diverting circuit branches coupled to said transconductance stage and which selectively divert current from said output, each further diverting circuit branches being configured to be isolated from said output.

11. An electronic circuit according to claim 1, embodied on an integrated circuit.

12. An electronic circuit according to claim 1, wherein said circuit is a VGA.

13. A method of improving the linearity of a variable gain amplifier having a transconductance stage which converts a power of an input signal into a current supplied to an output, said method comprising:
   providing an input signal to the transconductance stage;
   isolating the input signal from the output;
   diverting current from the output, the diverted current being isolated from the output; and
   feeding back a portion of the current diverted from the output to the input.

14. A variable gain amplifier, comprising:
   transconductance means having an input for receiving an input signal, said transconductance means converting a power of an input signal into a current and supplying the current to an output;
   isolation means for isolating the input signal from the output;
   current diverting means coupled to said transconductance means for selectively diverting the current of said transconductance stage away from said output to vary a gain of the variable gain amplifier from one gain level to another, lower gain level; and
   feedback means for feeding back a portion of the current diverted by said current diverting means to said input of said transconductance means to improve a linearity of the variable gain amplifier in the lower gain level, while maintaining said isolation of the input signal from the output.

* * * * *